United States Patent
Kim et al.

(10) Patent No.: US 9,099,686 B2
(45) Date of Patent: Aug. 4, 2015

(54) DONOR FILM, METHOD OF MANUFACTURING THE SAME, AND METHOD OF MANUFACTURING ORGANIC LIGHT EMITTING DISPLAY USING THE SAME

(71) Applicant: SAMSUNG DISPLAY CO., LTD., Yongin, Gyeonggi-Do (KR)

(72) Inventors: Hyo Yeon Kim, Yongin-si (KR); Ha-Jin Song, Yongin-si (KR); Sang-Woo Lee, Yongin-si (KR); Hye-Yeon Shim, Yongin-si (KR); Heun-Seung Lee, Yongin-si (KR); Kyul Han, Yongin-si (KR); Sang-Woo Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/943,564

(22) Filed: Jul. 16, 2013

(65) Prior Publication Data

US 2014/0225074 A1    Aug. 14, 2014

(30) Foreign Application Priority Data

Feb. 14, 2013  (KR) ........................ 10-2013-0015965

(51) Int. Cl.
*H01L 51/56* (2006.01)
*H01L 51/00* (2006.01)

(52) U.S. Cl.
CPC ............ *H01L 51/56* (2013.01); *H01L 51/0013* (2013.01)

(58) Field of Classification Search
CPC ........ H01L 51/0545; H01L 1/05; H01L 51/56
USPC .......... 257/40, E51.013, E51.017; 438/82, 99
See application file for complete search history.

(56) References Cited

U.S. PATENT DOCUMENTS

| | | | |
|---|---|---|---|
| 5,858,607 A | 1/1999 | Burberry et al. | |
| 2005/0186366 A1* | 8/2005 | Kim et al. | 428/32.81 |
| 2006/0046181 A1* | 3/2006 | Kim et al. | 430/199 |
| 2006/0084006 A1* | 4/2006 | Kang et al. | 430/199 |
| 2006/0222890 A1* | 10/2006 | Itoh | 428/690 |
| 2008/0107993 A1 | 5/2008 | Wolk et al. | |
| 2009/0266479 A1* | 10/2009 | Chung et al. | 156/247 |

FOREIGN PATENT DOCUMENTS

| | | |
|---|---|---|
| KR | 10-0832095 | 5/2008 |
| KR | 10-2009-0092270 | 8/2009 |
| KR | 10-1188548 | 10/2012 |

OTHER PUBLICATIONS

Korean Patent Abstracts, Publication No. 1020120053660 A, dated May 29, 2012, for corresponding Korean Patent 10-1188548.

* cited by examiner

*Primary Examiner* — Karen Kusumakar
*Assistant Examiner* — Adam S Bowen
(74) *Attorney, Agent, or Firm* — Christie, Parker & Hale, LLP

(57) ABSTRACT

A donor film includes a base film including a first area and a second area surrounding the first area, the second area having an organic material binding property that is different from an organic material binding property of the first area, a light-to-heat conversion pattern on the base film at the first area, a reflection layer on the base film at the second area, and a transfer layer on the light-to-heat conversion pattern and the reflection layer.

15 Claims, 5 Drawing Sheets

DONOR FILM, METHOD OF MANUFACTURING THE SAME, AND METHOD OF MANUFACTURING ORGANIC LIGHT EMITTING DISPLAY USING THE SAME

CROSS-REFERENCE TO RELATED APPLICATION

This application claims priority to and the benefit of Korean Patent Application No. 10-2013-0015965, filed in the Korean Intellectual Property Office on Feb. 14, 2013, the entire contents of which are incorporated herein by reference.

BACKGROUND

1. Field

The present disclosure relates to a donor film, a method of manufacturing the same, and a method of manufacturing an organic light emitting display using the same.

2. Description of the Related Art

In general, an organic light emitting display includes a thin film transistor substrate, an opposite substrate, and an organic light emitting device (or organic light emitting devices) disposed between the thin film transistor substrate and the opposite substrate. Each organic light emitting device includes an anode electrode partially exposed by a pixel definition layer, an organic layer disposed on the anode electrode, and a cathode electrode disposed on the organic layer. In each organic light emitting device, holes and electrons are injected into the organic layer through the anode electrode and the cathode electrode, respectively, and are recombined in the organic layer to generate excitons. The excitons emit energy as light when an excited state returns to a ground state.

The organic layer is formed through various methods, such as a deposition method, a printing method, or a transfer method.

In recent years, the transfer method has been researched, and methods of forming the organic layer in a fine transfer pattern using a donor film have been researched.

SUMMARY

Aspects of embodiments of the present invention are directed to providing a donor film capable of forming a fine transfer pattern, a method of manufacturing the donor film, and a method of manufacturing an organic light emitting display using the donor film.

Embodiments of the present invention are directed to a donor film including a base film including a first area and a second area surrounding the first area, the second area having an organic material binding property that is different from an organic material binding property of the first area; a light-to-heat conversion pattern on the base film at the first area; a reflection layer on the base film at the second area; and a transfer layer on the light-to-heat conversion pattern and the reflection layer.

A surface of the base film at the first area may be lyophilic and a surface of the base film at the second area may be liquid repellent.

The light-to-heat conversion pattern may include a light absorbing material dispersed in an organic binder. The light absorbing material may be carbon black.

The reflection layer may include one selected from aluminum, an aluminum alloy, silver, a silver alloy, magnesium, or a magnesium alloy.

The donor film may further include an intermediate layer between the transfer layer and the light-to-heat conversion pattern and between the transfer layer and the reflection layer.

Embodiments of the present invention are directed to a method of manufacturing a donor film including forming a first area on a base film having a lyophilic surface and forming a second area on the base film having a liquid repellant surface surrounding the first area; coating a mixture including a light absorbing material dispersed in an organic binder on the base film to form a light-to-heat conversion pattern on the base film at the first area; forming a reflection layer on the base film at the second area; and forming a transfer layer on the light-to-heat conversion pattern and the reflection layer.

The forming the first area and the forming the second area may include irradiating light onto the base film using a mask having an opening formed therethrough, such that the first area of the base film corresponds to the opening.

The light absorbing material may include carbon black.

The coating the mixture may include slit coating, spin coating, or inkjet printing the light absorbing material dispersed in the organic binder.

The reflection layer may include one selected from aluminum, an aluminum alloy, silver, a silver alloy, magnesium, or a magnesium alloy.

The method may further include forming an intermediate layer between the transfer layer and the light-to-heat conversion pattern and between the transfer layer and the reflection layer.

Embodiments of the present invention are directed to a method of manufacturing an organic light emitting display, including preparing an acceptor substrate including a thin film transistor substrate and a first electrode on the thin film transistor substrate; disposing a donor film on the acceptor substrate; irradiating a laser onto the donor film to form an organic layer on the first electrode; and forming a second electrode on the organic layer. The donor film may include a base film including a first area and a second area surrounding the first area, the first area having an organic material binding property that is different from an organic material binding property of the first area; a light-to-heat conversion pattern on the base film at the first area; a reflection layer on the base film at the second area; and a transfer layer on the light-to-heat conversion pattern and the reflection layer.

The light-to-heat conversion pattern may include a light absorbing material dispersed in an organic binder.

The reflection layer may include one selected from aluminum, an aluminum alloy, silver, a silver alloy, magnesium, or a magnesium alloy.

According to aspects of embodiments of the present invention, the donor film includes the reflection layer disposed at the area in which the light-to-heat conversion pattern is not disposed, and thus a fine transfer pattern may be formed. Therefore, the organic light emitting display manufactured using the donor film may include the fine transfer pattern as the organic layer.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
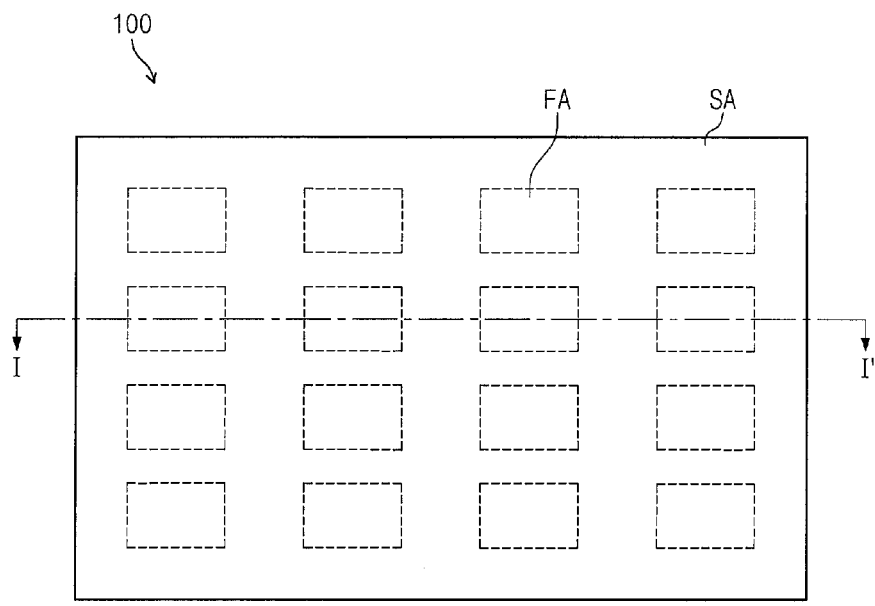
FIG. 1 is a plan view illustrating a donor film according to an embodiment of the present disclosure.

It will be understood that when an element or layer is referred to as being "on", "connected to," or "coupled to" another element or layer, it may be directly on, connected, or coupled to the other element or layer, or intervening elements or layers may be present. In contrast, when an element is referred to as being "directly on," "directly connected to," or "directly coupled to" another element or layer, no intervening elements or layers are present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a," "an," and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, the present disclosure will be explained in detail with reference to the accompanying drawings.

Figure 2:
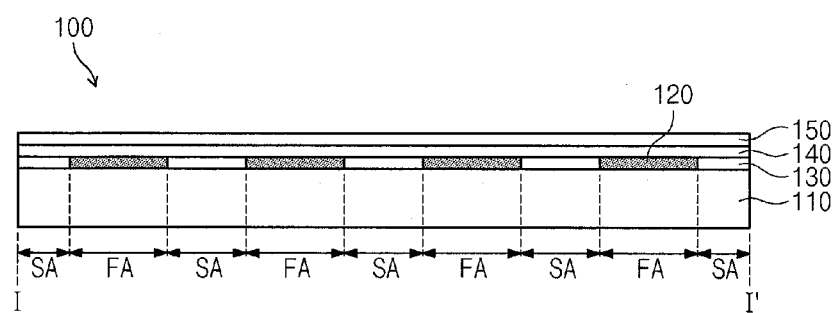
FIG. 2 is a cross-sectional view taken along the line I-I' of FIG. 1.

FIG. 1 is a plan view showing a donor film according to an embodiment of the present disclosure, and FIG. 2 is a cross-sectional view taken along a line I-I' of FIG. 1.

Referring to FIGS. 1 and 2, a donor film 100 includes a base film 110, a light-to-heat conversion pattern 120, a reflection layer 130, an intermediate layer 140, and a transfer layer 150.

The base film 110 includes a material having a high transmittance and a high heat resistance to light, e.g., a laser beam. For instance, the base film 110 may be, but is not limited to, polyethylene terephthalate (PET) film and/or polyethylene naphthalate (PEN) film. In addition, the base film 110 has a thickness in a range of about 10 μm to about 500 μm.

The base film 110 includes first areas FA arranged in a matrix configuration and a second area SA surrounding the first areas FA. The second area SA has a different binding property to an organic material from that of the first areas FA. A surface of the base film 110 in the first areas FA (e.g., at the first areas FA) is lyophilic (e.g., easily dispersed by a solvent) and a surface of the base film 110 in the second area SA (e.g., at the second area SA) is liquid repellent.

The light-to-heat conversion pattern 120 is disposed on the base film 110 in the first areas FA. Thus, the light-to-heat conversion pattern 120 is disposed on the base film 110 in the matrix configuration. The light-to-heat conversion pattern 120 may include an organic binder and a light absorbing material dispersed in the organic binder. The light absorbing material absorbs a light irradiated thereon from an external source (not shown) to convert the light to heat. In the present embodiment, the light absorbing material may be, but is not limited to, carbon black.

The reflection layer 130 is disposed on the base film 110 in the second area SA. That is, the reflection layer 130 is disposed in an area where the light-to-heat conversion pattern 120 is not disposed, to surround the light-to-heat conversion pattern 120. The reflection layer 130 has a light reflective property to reflect light incident to the donor film 100. For instance, the reflection layer 130 includes aluminum (Al), an aluminum alloy, silver (Ag), a silver alloy, magnesium (Mg), and/or a magnesium alloy.

The intermediate layer 140 is disposed on the light-to-heat conversion pattern 120 and the reflection layer 130. The intermediate layer 140 prevents the transfer layer 150 from being contaminated (or reduces the amount of contamination) by the light absorbing material included in the light-to-heat conversion pattern 120. Also, the intermediate layer 140 blocks out-gas generated from the light-to-heat conversion pattern 120. The intermediate layer 140 includes a material having a high heat resistance and has an adhesive force with respect to the transfer layer 150. The intermediate layer 140 includes an organic layer, an inorganic layer, or a multi-layer of organic layer(s) and inorganic layer(s). The organic layer may be a polymer film that includes an acrylic resin or an alkyd resin. The inorganic layer may be a metal oxide layer.

The transfer layer 150 is disposed on the intermediate layer 140. In addition, an area of the transfer layer 150 corresponding to the first areas FA is transferred to serve as an organic layer during a manufacturing process of an organic light emitting display. Thus, the transfer layer 150 includes at least a light emitting layer EML and has a multi-layered structure. As an example, the transfer layer 150 may include a hole injection layer HIL, a hole transport layer HTL, the light emitting layer EML, a hole blocking layer HBL, an electron transport layer ETL, and an electron injection layer EIL. The hole injection layer HIL injects the holes into the light emitting layer EML. The hole transport layer HTL has good hole transportability and controls movement of electrons, which are combined with the holes in the light emitting layer EML.

Thus, the hole transport layer HTL increases the chance of recombination of the holes and the electrons in the light emitting layer. The light emitting layer EML emits light according to the recombination of the injected holes and electrons. The hole blocking layer HBL controls the movement of holes, which are combined with the electrons in the light emitting layer EML. The electron transport layer ETL transports the electrons to the light emitting layer EML. The electron injection layer EIL injects the electrons into the light emitting layer EML. These layers may be made of suitable materials as known to those of ordinary skill in the art.

The donor film 100 includes the reflection layer 130 disposed in the second area SA. Although light is provided to the donor film 100, the light irradiated to the second area SA is reflected by the reflection layer 130. Thus, only the area of the transfer layer 150, which corresponds to the first areas FA in the donor film 100, is transferred to an acceptor substrate (not shown). As a result, a pattern of the transfer layer 150 transferred to the acceptor substrate may be finely controlled.

Hereinafter, a method of manufacturing the donor film will be described in detail with reference to FIGS. 3 to 7.

FIGS. 3 to 7 are cross-sectional views illustrating a manufacturing method of the donor film of FIGS. 1 and 2.

Figure 3:
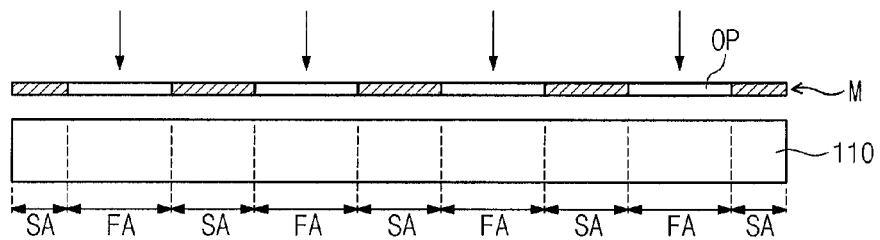
FIGS. 3 to 7 are cross-sectional views illustrating a manufacturing method of the donor film of FIGS. 1 and 2.

Referring to FIG. 3, the base film 110 is prepared. The base film 110 includes the material having the high transmittance and the high heat resistance to light, e.g., laser beam. For instance, the base film 110 includes polyethylene terephthalate (PET) film or polyethylene naphthalate (PEN) film. The base film 110 is surface-treated to be liquid repellent. The surface treatment may be a plasma treatment or a fluoride treatment.

Then, the light, e.g., an ultraviolet ray, is irradiated onto the surface of the base film 110 using a mask M having openings arranged in a matrix configuration. Areas of the base film 110, which correspond to the openings OP, have the lyophilic property as a result of the light irradiation (i.e., the ultraviolet ray irradiation). Thus, the base film 110 is divided into the first areas FA that are lyophilic and the second area SA that is liquid repellent.

Figure 4:
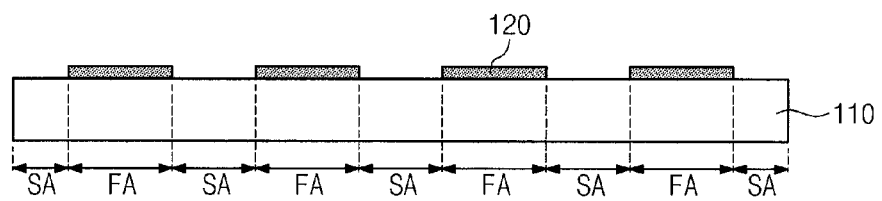

Referring to FIG. 4, after the ultraviolet ray is irradiated, the light-to-heat conversion pattern 120 is formed in the first areas FA on the base film 110.

In detail, a mixture including the organic binder and the light absorbing material dispersed in the organic binder is coated on the base film 110 in the first areas FA. The light absorbing material may be, but is not limited to, carbon black. In addition, the mixture may be coated using slit coating, spin coating, or inkjet printing.

Since the first areas FA are lyophilic and the second area SA is liquid repellent, the mixture is disposed only in the first areas FA having the lyophilic property. That is, the mixture is disposed only in the first areas FA without an additional patterning process, and thus the light-to-heat conversion pattern 120 is disposed in the first area FA on the base film 110.

Figure 5:
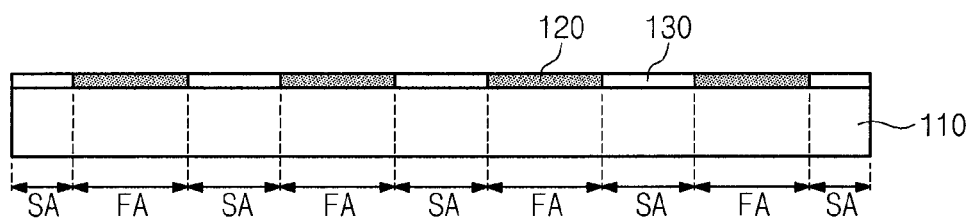

Referring to FIG. 5, after the light-to-heat conversion pattern 120 is formed, the reflection layer 130 is formed in the second area SA of the base film 110. The reflection layer 130 includes the material having the light reflective property. For instance, the reflection layer 130 includes aluminum (Al), an aluminum alloy, silver (Ag), a silver alloy, magnesium (Mg), and/or a magnesium alloy.

Magnesium (Mg) has a tendency not to bond with the light-to-heat conversion pattern 120 including the organic binder. Thus, when the reflection layer 130 includes magnesium (Mg), the reflection layer 130 is formed in the second area SA through a deposition process without employing an additional mask.

Figure 6:
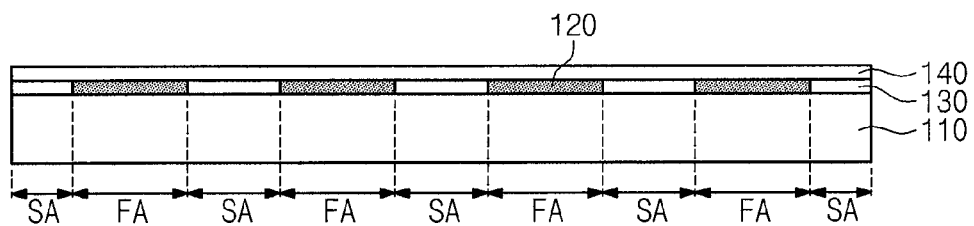

Referring to FIG. 6, after the reflection layer 130 is formed, the intermediate layer 140 is formed on the light-to-heat conversion pattern 120 and the reflection layer 130. The intermediate layer 140 is the organic layer, the inorganic layer, or the multi-layer of organic layer(s) and inorganic layer(s). The organic layer is the polymer film including an acrylic resin or an alkyd resin. The inorganic layer is the metal oxide layer.

The intermediate layer 140 prevents the transfer layer 150 from being contaminated by the light absorbing material (or reduces the contamination of the light absorbing material) included in the light-to-heat conversion pattern. In addition, the intermediate layer 140 blocks out-gas generated from the light-to-heat conversion pattern 120.

Figure 7:
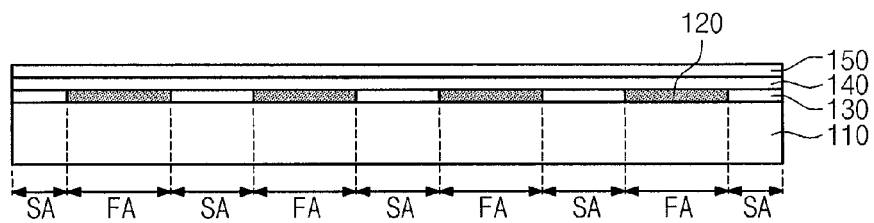

Referring to FIG. 7, after the intermediate layer 140 is formed, the transfer layer 150 is formed on the intermediate layer 140.

The transfer layer 150 includes at least the light emitting layer EML and has a multi-layered structure. As an example, the transfer layer 150 includes the hole injection layer HIL, the hole transport layer HTL, the light emitting layer EML, the hole blocking layer HBL, the electron transport layer ETL, and the electron injection layer EIL.

After the transfer layer 150 is formed, a protection film (not shown) may be attached to the transfer layer 150 to prevent the transfer layer 150 from being contaminated (or to reduce contamination of the transfer layer 150).

Figure 8:
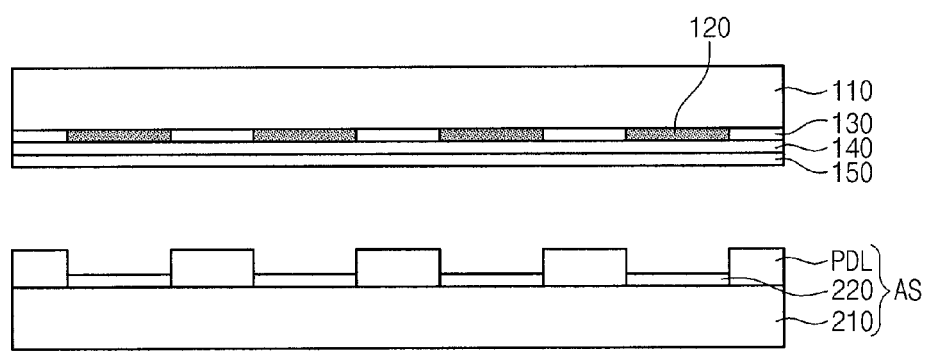
FIGS. 8 to 10 are cross-sectional views illustrating a manufacturing method of an organic light emitting display using the donor film of FIGS. 1 and 2.
Figure 9:
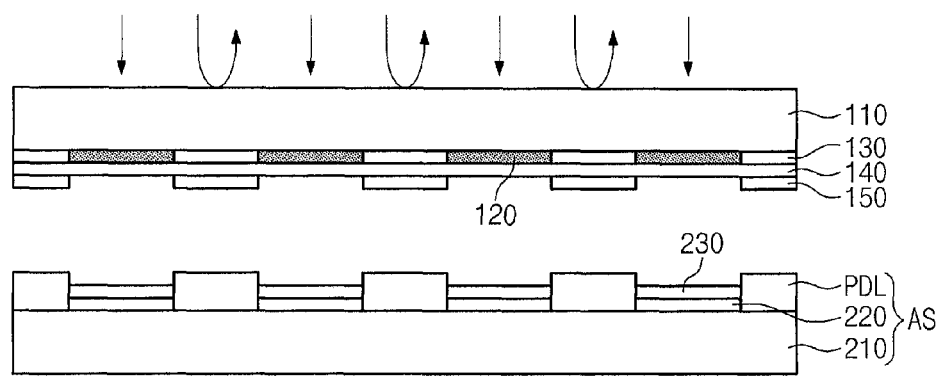
Figure 10:
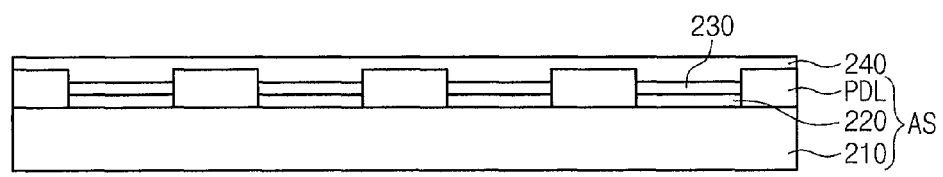

FIGS. 8 to 10 are cross-sectional views illustrating a manufacturing method of an organic light emitting display using the donor film of FIGS. 1 and 2. The organic light emitting display may be a rear surface light emitting type (e.g., bottom emission type) organic light emitting display, a front surface light emitting type (e.g., top emission type) organic light emitting display, or both surface light emitting type (e.g., dual emission type) organic light emitting display. However, hereinafter, the organic light emitting display will be described as a rear surface light emitting type organic light emitting display.

Referring to FIG. 8, the acceptor substrate AS is prepared. The acceptor substrate AS includes a thin film transistor substrate 210 and a first electrode 220 disposed on the thin film transistor substrate 210.

The thin film transistor substrate 210 includes a plurality of pixel areas. In addition, the thin film transistor substrate 210 includes a base substrate (not shown) and a thin film transistor (not shown) disposed on the base substrate. The base substrate may be a rigid type insulating substrate formed of a polymer, such as glass or a transparent plastic. When the base substrate includes the plastic substrate, the base substrate may include polyethylene terephthalate (PET), a fiber reinforced plastic, and/or polyethylene naphthalate (PEN). In addition, the base substrate may be a transparent flexible type insulating substrate.

The first electrode 220 is disposed in each pixel area and electrically connected to the thin film transistor. The first electrode 220 is a transparent conductive layer. For instance, the first electrode 220 includes a transparent conductive oxide material, such as indium tin oxide (ITO), indium zinc oxide (IZO), aluminum zinc oxide (AZO), gallium doped zinc oxide (GZO), zinc tin oxide (ZTO), gallium tin oxide (GTO), fluorine doped tin oxide (FTO), and/or the like.

Meanwhile, the first electrode 220 is exposed by a pixel definition layer PDL.

After the acceptor substrate AS is prepared, the donor film 100 is arranged on the acceptor substrate AS. The donor film 100 includes the base film 100, the light-to-heat conversion pattern 120, the reflection layer 130, the intermediate layer 140, and the transfer layer 150.

The base film 110 includes polyethylene terephthalate (PET) film or polyethylene naphthalate (PEN) film.

The light-to-heat conversion pattern 120 is disposed on the base film 110 in the matrix configuration. In addition, the light-to-heat conversion pattern 120 includes the organic binder and the light absorbing material dispersed in the organic binder. The light absorbing material absorbs the light irradiated thereon from the external source (not shown) and converts the light to heat. The light absorbing material may be, but is not limited to, carbon black.

The reflection layer 130 is disposed in the area of the base film 110, in which the light-to-heat conversion pattern 120 is not disposed, to surround the light-to-heat conversion pattern 120. The reflection layer 130 includes aluminum (Al), an aluminum alloy, silver (Ag), a silver alloy, magnesium (Mg), and/or a magnesium alloy to reflect the light incident to the donor film 100.

The intermediate layer 140 is disposed on the light-to-heat conversion pattern 120 and the reflection layer 130. The intermediate layer 140 prevents the transfer layer 150 from being contaminated (or reduces the contamination) by the light absorbing material of the light-to-heat conversion pattern 120. In addition, the intermediate layer 140 blocks out-gas generated from the light-to-heat conversion pattern 120.

The transfer layer 150 is disposed on the intermediate layer 140. The transfer layer 150 includes at least the light emitting layer EML and has a multi-layered structure. As an example, the transfer layer 150 includes the hole injection layer HIL, the hole transport layer HTL, the light emitting layer EML, the hole blocking layer HBL, the electron transport layer ETL, and the electron injection layer EIL.

After the donor film 100 is prepared, the donor film 100 is disposed on the acceptor substrate AS. The first electrode 220 faces the transfer layer 150, and the light-to-heat conversion pattern 120 is disposed to correspond to the first electrode 220.

Referring to FIG. 9, after the donor film 100 is disposed on the acceptor substrate AS, a laser beam is irradiated onto the base film 110 of the donor film 100.

The laser beam irradiated onto the base film 110 transmits through the base film 110 and is irradiated onto the light-to-heat conversion pattern 120 and the reflection layer 130. The light-to-heat conversion pattern 120 absorbs the laser beam to convert the laser beam to heat. The reflection layer 130 reflects the laser beam to prevent the laser beam from being irradiated onto the transfer layer 150 where the reflection layer 130 is present.

The heat generated from the light-to-heat conversion pattern 120 decreases the adhesive force between the intermediate layer 140 and the transfer layer 150. Thus, the transfer layer 150 (having the same shape as the light-to-heat conversion pattern 120) is transferred to the first electrode 220 of the acceptor substrate AS. The transfer layer 150 transferred to the first electrode 220 may serve as an organic layer 230 of the organic light emitting display.

Referring to FIG. 10, a second electrode 240 is formed on the organic layer 230.

The second electrode 240 includes a material having a work function smaller than that of the first electrode 220. For instance, the second electrode 240 includes at least one of Mo, W, Mg, Al, Pt, Pd, Au, Ni, Nd, Ir, Cr, Li, Ca, and/or alloys thereof. In addition, a conductive layer (not shown) may be further disposed on the second electrode 240 to prevent or reduce a voltage drop (IR-drop) of the second electrode 240.

After the second electrode 240 is formed, a sealing process may be performed to manufacture the organic light emitting display. In detail, a sealing substrate (not shown) including a transparent insulating material is disposed on the second electrode 240, and the thin film transistor substrate 210 and the sealing substrate are coupled to each other, to thereby manufacture the organic light emitting display.

In addition, an insulating layer (not shown) is formed on the second electrode 240 to isolate a lower structure of the insulating layer from the external environment. Thereby, the organic light emitting display is manufactured.

Although embodiments of the present disclosure have been described, it is understood that the present disclosure should not be limited to these embodiments, and various changes and modifications can be made by one of ordinary skill in the art within the spirit and scope of the present disclosure as defined by the following claims, and equivalents thereof.

What is claimed is:

1. A donor film comprising:
   a base film including a first area and a second area surrounding the first area, the second area having an organic material binding property that is different from an organic material binding property of the first area;
   a light-to-heat conversion pattern bound to the base film at the first area by the organic material binding property of the first area;
   a reflection layer on the base film at the second area; and
   a transfer layer on the light-to-heat conversion pattern and the reflection layer.

2. The donor film of claim 1, wherein a surface of the base film at the first area is lyophilic and a surface of the base film at the second area is liquid repellent.

3. The donor film of claim 1, wherein the light-to-heat conversion pattern comprises a light absorbing material dispersed in an organic binder.

4. The donor film of claim 1, wherein the light absorbing material comprises carbon black.

5. The donor film of claim 1, wherein the reflection layer comprises one selected from the group consisting of aluminum, an aluminum alloy, silver, a silver alloy, magnesium, and a magnesium alloy.

6. The donor film of claim 1, further comprising an intermediate layer between the transfer layer and the light-to-heat conversion pattern and between the transfer layer and the reflection layer.

7. A method of manufacturing a donor film, comprising:
   forming a first area on a base film having a lyophilic surface and forming a second area on the base film, the second area having a liquid repellant surface and surrounding the first area;
   coating a mixture including a light absorbing material dispersed in an organic binder on the base film to form a light-to-heat conversion pattern on the base film at the first area;
   forming a reflection layer between portions of the light-to-heat conversion pattern on the base film at the second area, the reflection layer and the light-to-heat conversion pattern being formed on a same side of the base film; and
   forming a transfer layer on the light-to-heat conversion pattern and the reflection layer.

8. The method of claim 7, wherein the forming the first area and the forming the second area comprise irradiating light onto the base film using a mask having an opening formed therethrough, such that the first area of the base film corresponds to the opening.

9. The method of claim 8, wherein the light absorbing material comprises carbon black.

10. The method of claim 8, wherein the coating the mixture comprises slit coating, spin coating, or inkjet printing the light absorbing material dispersed in the organic binder.

11. The method of claim 10, wherein the reflection layer comprises one selected from the group consisting of aluminum, an aluminum alloy, silver, a silver alloy, magnesium, and a magnesium alloy.

12. The method of claim 7, further comprising forming an intermediate layer between the transfer layer and the light-to-heat conversion pattern and between the transfer layer and the reflection layer.

13. A method of manufacturing an organic light emitting display, comprising:

preparing an acceptor substrate comprising a thin film transistor substrate and a first electrode on the thin film transistor substrate;

disposing a donor film on the acceptor substrate;

irradiating a laser beam onto the donor film to form an organic layer on the first electrode; and forming a second electrode on the organic layer, the donor film comprising:

a base film including a first area and a second area surrounding the first area, the second area having an organic material binding property that is different from an organic material binding property of the first area;

a light-to-heat conversion pattern bound to the base film at the first area by the organic material binding property of the first area;

a reflection layer on the base film at the second area; and a transfer layer on the light-to-heat conversion pattern and the reflection layer.

14. The method of claim 13, wherein the light-to-heat conversion pattern comprises a light absorbing material dispersed in an organic binder.

15. The method of claim 14, wherein the reflection layer comprises one selected from the group consisting of aluminum, an aluminum alloy, silver, a silver alloy, magnesium, and a magnesium alloy.

* * * * *